(12) United States Patent
Kalafala et al.

(10) Patent No.: US 8,056,038 B2
(45) Date of Patent: Nov. 8, 2011

(54) METHOD FOR EFFICIENTLY CHECKPOINTING AND RESTARTING STATIC TIMING ANALYSIS OF AN INTEGRATED CIRCUIT CHIP

(75) Inventors: Kerim Kalafala, Rhinebeck, NY (US); Hemlata Gupta, Hopewell Junction, NY (US); David J. Hathaway, Underhill, VT (US); Jeffrey G. Hemmett, St. George, VT (US)

(73) Assignee: International Business Machines Corporation, Armonk, NY (US)

( * ) Notice: Subject to any disclaimer, the term of this patent is extended or adjusted under 35 U.S.C. 154(b) by 366 days.

(21) Appl. No.: 12/354,360

(22) Filed: Jan. 15, 2009

(65) Prior Publication Data

US 2010/0180244 A1    Jul. 15, 2010

(51) Int. Cl.
*G06F 17/50* (2006.01)
(52) U.S. Cl. .................................. 716/113; 716/112
(58) Field of Classification Search ........... 716/111–114
See application file for complete search history.

(56) References Cited

U.S. PATENT DOCUMENTS

| | | | |
|---|---|---|---|
| 5,508,937 A | 4/1996 | Abato et al. | |
| 7,103,863 B2 * | 9/2006 | Riepe et al. | 716/113 |
| 7,761,828 B2 * | 7/2010 | Miczo | 716/103 |
| 2004/0044979 A1 * | 3/2004 | Aji et al. | 716/13 |
| 2008/0163147 A1 | 7/2008 | Gregerson et al. | |

* cited by examiner

*Primary Examiner* — Jack Chiang
*Assistant Examiner* — Binh Tat
(74) *Attorney, Agent, or Firm* — H. Daniel Schnurmann (57) ABSTRACT

A method for loading checkpoint timing in an environment where the boundary arrival times, slews, required arrival times, or loads differ from the checkpoint run. A timing checkpoint file generated for one or more hierarchical modules, during which each input is assigned a unique phase tag. The association of unique phase tags allows subsequent restart analyses to efficiently adjust the checkpoint timing in relation to the restart timing environment. In the restart run, one or more such checkpoint files is read, during which an initial propagation of arrival, required arrivals and slew times are performed, followed by a local re-update based on adjusted arrival times and the required arrival times. Finally, if multiple hierarchical modules are updated, a global recalculation of timing values is performed based on a slack change threshold in order to determine whether any new timing failures have been introduced.

16 Claims, 5 Drawing Sheets

METHOD FOR EFFICIENTLY CHECKPOINTING AND RESTARTING STATIC TIMING ANALYSIS OF AN INTEGRATED CIRCUIT CHIP

FIELD OF THE INVENTION

The present invention generally relates to the field of Design Automation of semiconductor chips, and more particularly, to a system and method for checkpointing and assessing the timing performance of an integrated circuit (IC) chip in the presence of incremental boundary condition updates.

RELATED PRIOR ART

The significance of variability in modern IC chip designs and manufacturing processes is critical and cannot be ignored. Statistical static timing analysis (SSTA) has emerged as a solution to address these issues and considers the impact of variations to circuit analysis and optimization. The goal of static timing analysis (STA) is to determine the latest and earliest possible switching times of various signals within a digital circuit. STA may generally be performed at the transistor level or at the gate level, using pre-characterized library elements, or at higher levels of abstraction for complex hierarchical chips.

STA algorithms operate by first levelizing the logic structure and breaking any loops in order to create a directed acyclic graph (timing graph). Modern designs can often contain millions of placeable objects, with corresponding timing graphs having millions, if not tens of millions of nodes. For each node, a corresponding arrival time (AT), transition rate (slew), and required arrival time (RAT) are computed for both rising and falling transitions as well early and late mode analysis. An AT value represents the latest or earliest time at which a signal can transition due to the entire upstream fan-in cone. A slew value is the transition time (e.g., the time for the signal to transition from 10% of its final value to 90% of its final value) associated with a corresponding AT, and a RAT represents the latest or earliest time at which a signal must transition due to timing constraints in the entire downstream fan-out cone.

Delays and slews of edges in a timing graph may be dependent on many parameters, typically including a loading value at the sink end of the edge (e.g., at the output of a gate) and a slew value at the source end of the edge (e.g., at the input of a gate). Typically, an exact delay value for an edge in a timing graph is unknown, but instead only a range of possible delay values can be determined between some minimum delay and maximum delay.

ATs are propagated forward in a levelized manner, starting from the design primary input asserted (i.e., user-specified) ATs, and ending at either primary output ports or intermediate storage elements. For single fan-in cases, the AT at a sink node is determined by $AT$ sink node=$AT$ source node+delay from source to sink.

Whenever multiple signals merge, each fan-in contributes a potential AT computed as $AT$ sink (potential)=AT source+delay, making it possible for the maximum (late mode) or minimum (early mode) of all potential ATs to be retained at the sink node. If only a range of delay values for an edge is known, maximum delays are used to compute late mode ATs and minimum delays are used to compute early mode ATs.

Slew values are typically propagated forward along with AT values. The slew value for a node is typically the edge slew value for the incoming edge along which the dominant (maximum or minimum) AT value for the node was propagated. Alternatively, the slew value for a node may be selected as the maximum (for late mode) or minimum (for early mode) of all incoming edge slews.

RATs are computed in a backward levelized manner starting from either asserted RATs at the design primary output pins, or from tests (e.g., setup or hold constraints) at internal storage devices. For single fan-out cases RAT source node=RAT sink node−delay.

When multiple fan-outs merge (or when a test is present), each fan-out (or test) contributes a prospective RAT, enabling the minimum (late mode) or maximum (early mode) RAT to be retained at the source node. When only a range of possible delay values can be determined, maximum delay are used to compute late mode RATs and minimum delays are employed to compute early mode RATs.

The difference between the AT and the RAT at a node (i.e., RAT−AT in late mode, and AT−RAT in early mode) is referred to as slack. A positive slack implies that the current AT at a given node meets all downstream timing constraints, and a negative slack is indicative that the AT fails at least one such downstream timing constraints. A slack threshold may be specified for a timing analysis, indicating a lower bound on an allowable slack value for any node. A slack margin for a node may be defined as the amount by which the node slack is greater than the slack threshold.

A node may have multiple AT, RAT, and slew values associated with it, each denoted by a separate and unique phase tag in order to represent data associated with different clock domains (i.e., launched by different clock signals), or for the purpose of distinguishing information for a specific subset of an entire fan-in or fan-out cone. The critical AT of a node is the maximum late mode or minimum early mode AT, and the critical AT phase tag is the phase tag with which the critical AT value is associated. The critical RAT of a node is the minimum late mode or maximum early mode RAT, and the critical RAT phase tag is the phase tag with which the critical RAT value is associated. An optimistic estimate of an AT or RAT is an estimate that is less critical than an actual value (a lesser value of a late mode AT or early mode RAT, or a greater value of an early mode AT or late mode RAT), and a pessimistic estimate of an AT or RAT is an estimate that is more critical than an actual value (a greater value of a late mode AT or early mode RAT, or a lesser value of an early mode AT or late mode RAT).

Timing analysis runs for modern digital integrated circuits can often take hours, if not days, and consume in excess of 100 GB of memory. Furthermore, designers may keep runs active for several days after the initial analysis is completed for the purpose of generating additional reports and diagnostic data. In order to reduce the time average memory load, prior art checkpoint/restart techniques have been developed which allow for computed timing information to be saved on disk (e.g., as a checkpoint file) and efficiently restored (in a restart run) in a fraction of the time that it would take to recomputed timing values from scratch.

Prior art methodologies to the aforementioned problem are described, for instance, in U.S. Application Ser. No. 11/619, 349 of common assignee, herein incorporated by reference in all its details, in which a method for checkpoint/restart is described wherein all delay, AT, slew, and RAT are saved for a subset of the overall design. The aforementioned method, however, does not allow for an efficient recalculation of the values if any boundary conditions (e.g., primary input ATs/slews, or primary output RATs/loads) change.

Another prior method is referred to as technique of abstraction, in which only delay functions are stored on disk as an abstract file. The abstraction approach, however, requires that all ATs, slews, and RATs be recalculated, regardless of whether or not the boundary conditions have changed relative to the original environment.

Checkpoint/restart techniques are used during a static timing analysis of ICs to save results from one run and reloading data into a new run in an efficient manner. For example, a designer may chose to checkpoint a timing run which takes many hours, or even days, to complete an initial analysis. At a future time, the timing checkpoint file can be read in to restart run in a matter of a few minutes in order to generate additional reports or perform what-if analysis.

However, the aforementioned techniques for checkpoint/restarting a static timing analysis run require the restart environment to be identical to the original checkpoint environment, e.g., the restart environment needs to have identical boundary ATs/RATs/Slews/Loads in order for prior checkpoint timing to produce a correct static timing analysis result. Often, this limitation reduces the applicability and use of checkpoint/restart capabilities. For example, in cases where individual levels of hierarchy are being analyzed out of context, one generally does not know a priori the exact data input AT and neither slew values, nor the exact output RATs and loading conditions. Therefore, it becomes virtually impossible to generate a checkpoint file "out of context" for an individual level of hierarchy and subsequently re-use this analysis in a full-chip environment where different ATs, RATs, slews, and loads are propagated to individual hierarchical boundary points. Incremental timing methods, as in, for instance, U.S. Pat. No. 5,508,937, herein incorporated by reference in all its details, provide means of updating timing values in response to changes in design or in its timing constraints. The aforementioned method, however, does not teach means of reusing "out of context" timing results for a design partition in the timing of a design containing that partition.

Thus, there is a need in industry of a system and a method for checkpointing and restarting static timing analysis that works safely and efficiently under conditions where the checkpoint and restart timing environments differ, such that recalculation of the data is limited on the set of actual incremental boundary condition updates between those checkpoint and restart timing environments.

SUMMARY OF EMBODIMENTS OF THE INVENTION

In one aspect of the present invention, there is provided a timing checkpoint file generated for one or more hierarchical modules, during which the generation of each input is assigned a unique phase tag. The association of unique phase tags allows the subsequent restart analysis to efficiently adjust checkpoint timing in relation to the restart timing environment. In the restart run, at least one such checkpoint file is read, during which an initial propagation of ATs, RATs, and slews is performed, followed by a local re-update based on adjusted ATs and RATs. Finally, if multiple hierarchical modules are updated, a global recalculation of timing values is performed based on a slack change threshold in order to determine whether any new timing failures have been introduced.

In another aspect of the invention, there is provided a method for measuring the timing performance of an integrated circuit (IC) chip represented by a top-level design, the method including: a) performing a static timing run on at least one partition of the top-level design, each input of the at least one partition being assigned a unique phase tag; b) determining dependencies of timing values on at least one partition boundary conditions; c) generating checkpoint timing based on the determined dependencies of timing values; d) applying the checkpoint timing to a subsequent static timing run that includes new values of said at least one new boundary condition; e) performing a local update of the timing values and dependencies thereof based on the new boundary condition values; and f) measuring the timing performance of the at least one partition based upon the locally updated timing values.

BRIEF DESCRIPTION OF DRAWINGS

The novel features believed characteristic of the invention are set forth in the appended claims. The invention itself, however, as well as a preferred mode of use, further objects and advantages thereof, will best be understood by reference to the following detailed description of an illustrative embodiment when read in conjunction with the accompanying drawings, where:

DETAILED DESCRIPTION OF PREFERRED EMBODIMENTS

The present invention and various features, aspects and advantages thereof are explained more fully with reference to the non-limiting embodiments that are illustrated in the accompanying drawings and detailed in the following description.

Figure 1:
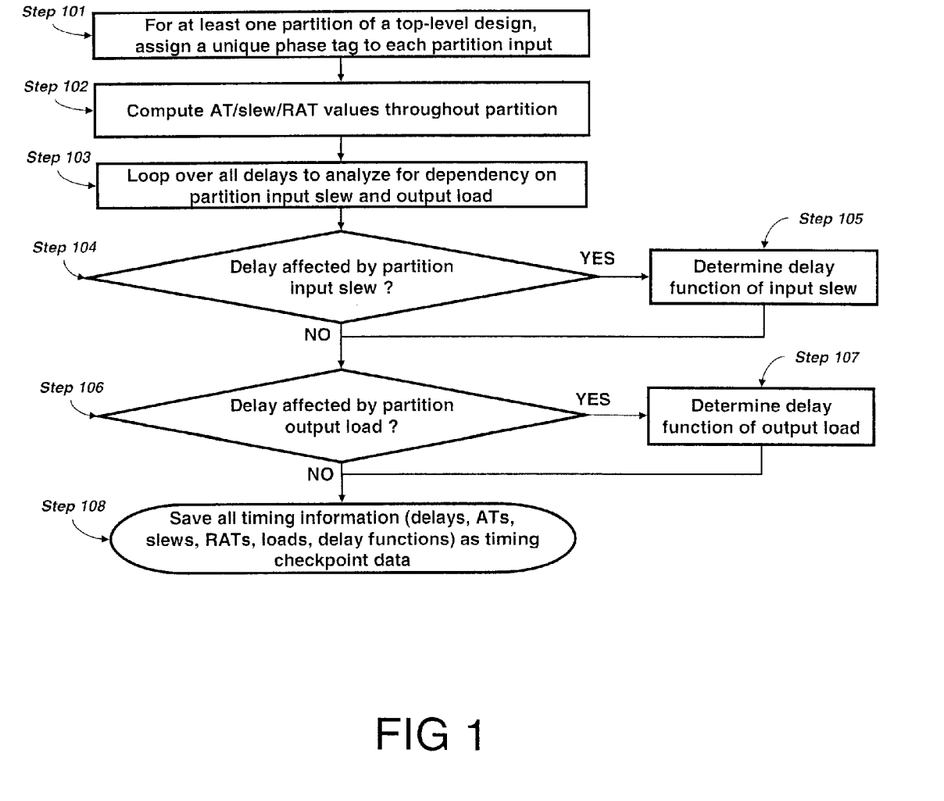
FIG. 1 shows a flowchart illustrating a checkpoint timing run according to an embodiment of the present invention.

Referring to FIG. 1, there is shown an illustrative flowchart of a checkpoint timing run according to present invention.

Initially, a top-level version of the IC chip design is partitioned, a checkpoint analysis run is performed starting from Step 101, and a unique phase tag is assigned to each partition input port.

In Step 102, timing values, including ATs, slews, and RATs propagate within the partition. This propagation is based on boundary conditions, including estimated ATs and slews at all the partition input ports, and estimated RATs and output loads at all the partition output ports. During propagation, if a bound is established at the maximum expected error across all input AT values (i.e., the maximum difference between the estimated AT boundary condition used for an input port and the actual AT that will be present when the checkpointed partition timing data is later reused), then non-critical phases may be safely pruned from the timing graph (i.e., removed from some nodes) under certain conditions. More specifically, a non-critical phase tag and associated AT and slew are safely removed from a node when the difference between AT and the critical AT for the node exceeds the sum of the maximum potential critical AT optimism and the minimum potential non-critical AT pessimism. If specific optimism and pessimism value bounds for the input port ATs are unknown, a non-critical phase tag and its associated AT and slew can be safely removed from a node when the difference between AT and the critical node AT is greater than twice the maximum expected error across all input AT values. Other criteria for pruning non-critical AT values and associated phase tags may also be employed.

In Step 103, each timing graph edge within the partition is analyzed for dependency on partition input slew and partition output load.

In Step 104, for each timing graph edge within the partition, a determination is made to establish whether the corresponding delay varies as a function of partition input slew. A variety of techniques is contemplated in order to determine which delays are dependent of the input port slew value. For example, in one embodiment, when the slew value of a particular partition input port varies (i.e., the values for the phase tag associated with the input port are evaluated using two different values of input slew for the port), then any timing graph edge within the partition showing delay changes is labeled as dependent upon the slew value at the partition input port. Additional efficiencies can be achieved by considering only timing graph edges which propagate a phase tag corresponding to the input port. In another embodiment, sensitivity values are determined and propagated along with ATs and slews for each phase tag, and an edge to which a non-negligible slew sensitivity is propagated is identified as being dependent upon the input port slew value. In still another embodiment, all timing graph edges within a specified logic depth of a given partition's input port which propagate a phase tag corresponding to the input port are identified as dependent upon the input's port slew value.

In Step 105, for any timing graph edge whose delay is determined to be dependent on a given partition input port slew value, a delay function of slew is determined at the input port. For example, one such delay function uses a pre-characterized library or equation to evaluate the delay as a function of slew. Because the pre-characterized functions are typically in terms of an immediate source node slew, they may include composing slew functions along the path(s) from the input port upon which the slew and delay dependency is determined at the source of the edge. They include composing the path slew function with the pre-characterized delay function of the edge. In another embodiment, the first order derivative of delay with respect to input slew is computed for each delay edge and appropriately chain-ruled along the path from the partition input port to the delay whose sensitivity function is being determined. In yet another embodiment, known as finite-differencing, propagated slews and resultant delays may be computed for two or more values of the input port slew to determine a linear or higher order delay function. Other more complex higher order representations are possible and have been implemented, all well within the scope of these preferred embodiments.

In Step 106, for each timing graph edge, a determination is made as to whether a corresponding delay varies as a function of partition output load. A variety of techniques determine which delays are dependent upon the output port load. By way of example, in one embodiment, the load value at a particular partition output port may vary, in which case any timing graph edge whose delay changes is labeled as dependent upon the load value at the partition output. In yet another embodiment, all the timing graph edges within a specified logic depth at a given output port are assumed to be dependent upon the partition output load value.

In Step 107, for any such timing graph edges whose delay is deemed to be dependent on partition output load, a delay function of the load at the output port is determined. By way of example, one such delay function utilizes a pre-characterized library or equation to evaluate the delay as a function of output load. In another embodiment, a first order derivative of delay with respect to output load is computed and appropriately chain ruled. Other more complex higher order representations are possible within the scope of the aforementioned embodiments.

In Step 108, all the timing data of a partition including ATs, RATs, SLEW times and delay functions with respect to the input slew and output load are advantageously saved as timing checkpoint timing. Moreover, values used as boundary conditions for the partition analysis, including asserted input AT, slew, output RAT, and partition output port load, are preferably saved during the timing checkpoint timing.

When a checkpoint timing of a partition is reused, e.g., in a restart analysis of a design containing that partition, phase tags and associated timing values on input and output ports and on internal nodes of the partition need at various steps to be translated between the input phase tags used in the partition checkpoint timing run and the "global" phase tags used in timing analysis of the larger design containing the partition. This translation method will be described hereinafter with reference to FIG. 2.

Figure 2:
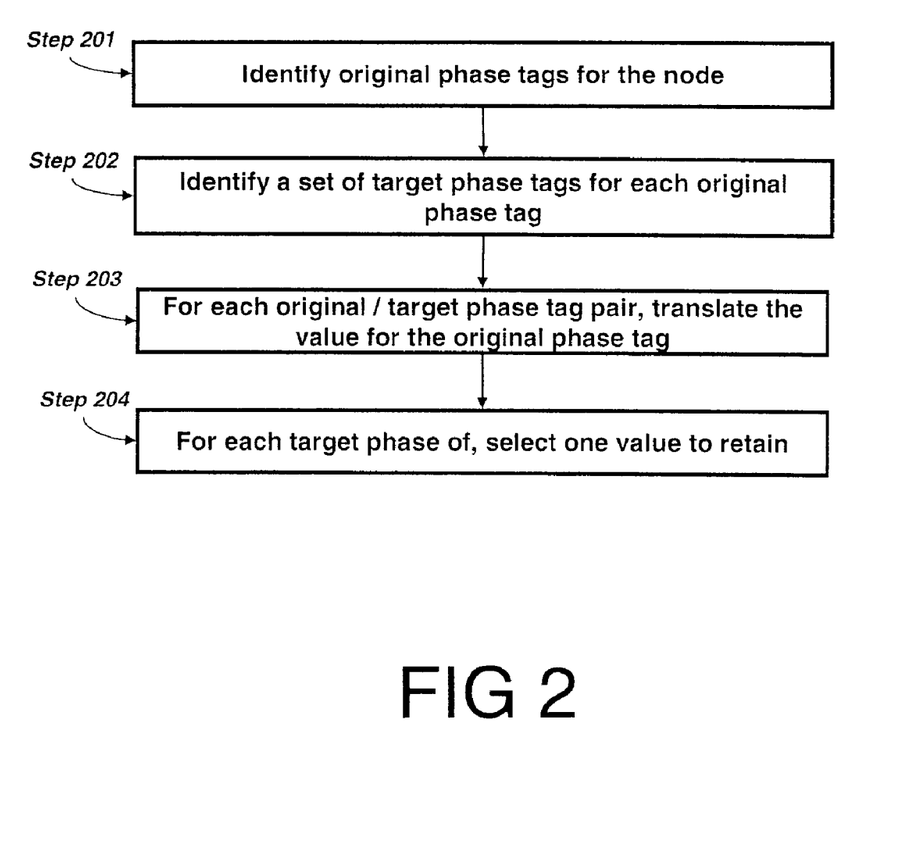
FIG. 2 shows a flowchart illustrating a phase and value translation process according to an embodiment of the present invention.

In Step 201, the set of original phase tags for the node are identified. These include phase tags for which values of the sort to be translated exist at the node, but are dependent on the translation being performed. The phase tags may include partition input phase tags, global phase tags, output (RAT) phase tags, and the like.

In Step 202, for each original phase tag, a set of target phase tags is identified. Depending on the specific case of phase translation being conducted, the target set may consist of global phase tags or may correspond to different pairs, such as input phase tag and global phase tag.

In Step 203, a value translation is performed for each target phase tag of each original phase tag. Depending on the particular case, the value translation may include adding a delta or an offset value of the original one. For example, when translating the partition phase tag AT, the slew values containing design phase tag AT and slew values on an internal node of the partition, AT will have added to it the difference between the target phase tag AT at the input port associated with the original phase tag, as well as the boundary condition of the AT used for that input port phase in the checkpoint timing run. Since several of the original phase tags may include a particular target phase tag in their mapping set which may result in multiple new timing values for a particular target phase tag. In Step 204, for each target phase tag, a single value of a given type (i.e., a single AT, single RAT, and/or single slew) of the potential multiple values translated to the target phase on the node are selected and retained. The selection method depends on the particular timing value type and timing mode. The maximum of all values for a phase tag is preferably retained for late mode AT and early mode RAT values, while the minimum of all the values for the target phase tag are retained for early mode AT and late mode RAT. The slew retained for a specific target phase tag may be one that was associated with the AT that was retained for that target phase. Alternatively, it may be the maximum or minimum of all the slew values translated to the target phase, resulting from different methods of slew propagation. The slew associated with each target phase is preferably determined according to the method of slew propagation used, and in most cases selected as the slew associated with the same phase tag from which the AT value selected in Step 204 was derived.

Figure 3:
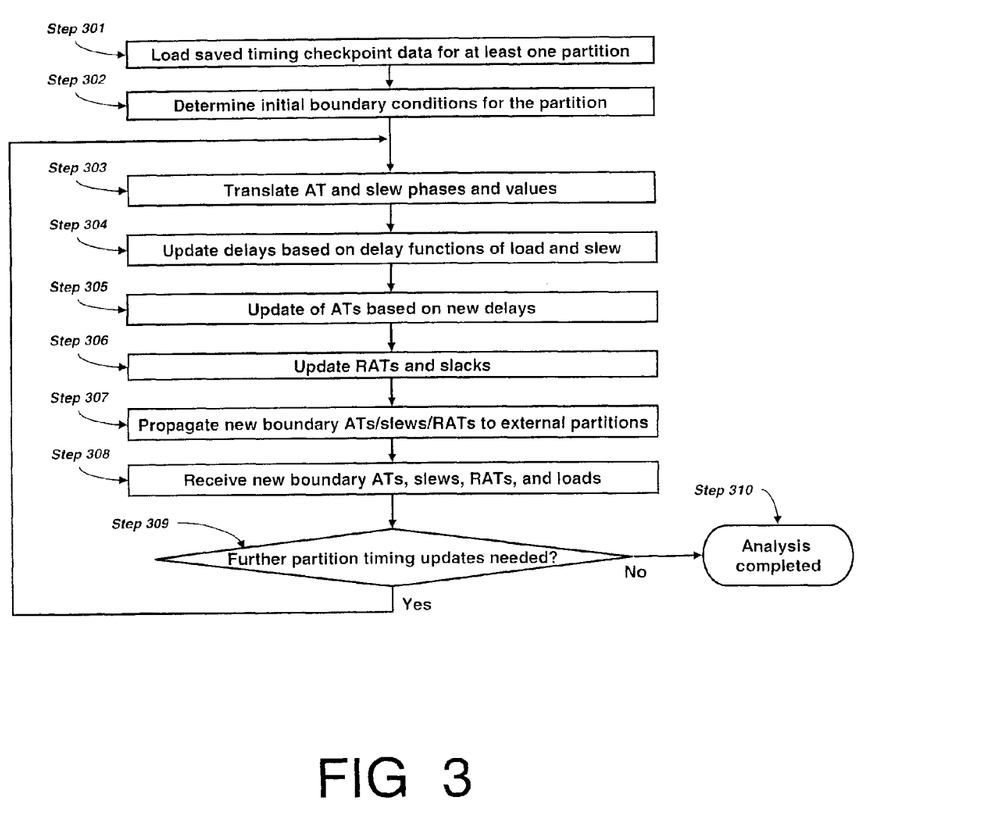
FIG. 3 shows a flowchart illustrating a first embodiment of a restart timing run of the present invention.

Referring to FIG. 3, a first embodiment of a restart analysis run is illustrated. Starting from Step 301, a timing checkpoint timing preferably consisting of ATs, slews, RATs, delay functions, and external loads from the checkpoint analysis run is loaded for at least one partition of the top-level design. In Step 302, an initial set of boundary conditions and phase tags for the partition is determined. They may include the boundary conditions stored in the checkpoint file or partial values propagated to the boundaries of the partition from the remainder of the design, or some combination thereof (e.g., estimated input port slew values based on the immediate drive of the port, with ATs and RATs from the checkpoint timing run).

In steps 303 through 306, values and phase tags from the checkpoint timing run are adjusted and translated based on the phase tags and boundary conditions corresponding to the partition. In Step 303, AT and slew values from the checkpoint timing run are translated according to the method previously described with reference to FIG. 2.

The translation of Step 303 creates a target phase tag set which is a cross-product between the input port phase tags used in the checkpoint timing run and the global phase tags determined in Step 302. More specifically, a target phase tag is created for each combination of the input port phase tag, and the global phase tag is propagated to the input port (Step 302). The effect of the choice of target phase tags ensures that only one value is associated with each target phase tag (Step 203, FIG. 2). Consequently, the selection of the value to be retained (Step 204, FIG. 2) has only one possibility. Subsequent invocations of Step 303 enable updating each AT value of the node based on the most recent change in value of AT at the given input port of the partition. For example, letting $AT\_p\_m(n)$ be the phase p AT for mode m (late or early) for node n, if a checkpoint timing run has two inputs A and B and two phase tags, the initial boundary timing information for input A includes phases X and Y, and the initial boundary timing information for input B includes only phases Y, target phases AX, AY, and BX used in the translation. Continuing with the present example, if a node N in the checkpointed partition includes both phase tag A and B, the AT translation is determined by $$AT\_AX\_late(N)=AT\_A\_late(N)+AT\_X\_late(A)-AT\_A\_late(A)$$

$$AT\_AX\_early(N)=AT\_A\_early(N)+AT\_X\_early(A)-AT\_A\_early(A)$$

$$AT\_AY\_late(N)=AT\_A\_late(N)+AT\_Y\_late(A)-AT\_A\_late(A)$$

$$AT\_AY\_early(N)=AT\_A\_early(N)+AT\_Y\_early(A)-AT\_A\_early(A)$$

$$AT\_BX\_late(N)=AT\_B\_late(N)+AT\_X\_late(B)-AT\_A\_late(B)$$

$$AT\_BX\_early(N)=AT\_B\_early(N)+AT\_X\_early(B)-AT\_A\_early(B)$$

In Step 304, the delays of each timing graph are updated based on the aforementioned delay functions for the input slew and output load. Generally, assuming that a timing graph edge (E) depends on an input slew having a delta value of (S), and further depends on the output load having a delta value of (L), then $$Delay(E)update=Delay(E)checkpoint+slew\ function\ (S)+load\ function(L)$$

Generally, only a small fraction of the timing graph edges depends on either the input slew or output load. Hence, the majority of delay values do not require to be recomputed.

In Step 305, ATs are updated based on the updated delay values. Only a small fraction of the delays depend on the input slew and output load and, only a subset of input slew and output load values are typically updated in an incremental fashion. The dominance limiting is instrumental in reducing the region requiring delay updates. Thus, the AT update described results in many fewer calculations compared to prior art techniques, such as abstraction, which requires recalculating all the ATs in a subsequent analysis run.

In Step 306, RATs are updated responsive to any AT or delay changes in the aforementioned steps. In addition, RAT updates may occur due to RAT changes at partition output ports. In one embodiment, boundary RAT changes are propagated in a brute force mode using the level limited and dominance limited RAT propagation. In another embodiment, a RAT specific phase tag is propagated backward through the logic, such that the RATs are updated directly based on a backward phase tag correspondence with an associated output port. In this case, the AT and RAT phases of nodes in the partition will be different, and a phase translation of RAT values will be required from each RAT phase of a node to each AT of the node in order to compute the slack(s) of the node, according to the method described with reference to FIG. 2.

In Step 307, a new partition input RATs and partition output ATs (if any) are communicated to external partitions. In Step 308, new boundary conditions are received at the boundaries of the partition resulting from, e.g., updates propagated from other partitions.

In Step 309, a determination is made as to whether timing updates are to be performed. One way of making this determination is by requiring updates when any boundary conditions changed. This can cause more timing updates than necessary to determine whether the timing requirements are met. A more efficient decision approach will be described hereinafter with reference to FIG. 5. If it is determined that no timing updates are needed, the method proceeds to Step 310, and the analysis is complete. Otherwise, the method branches back to Step 303 to initiate the next group of phase translations and updates.

Figure 4:
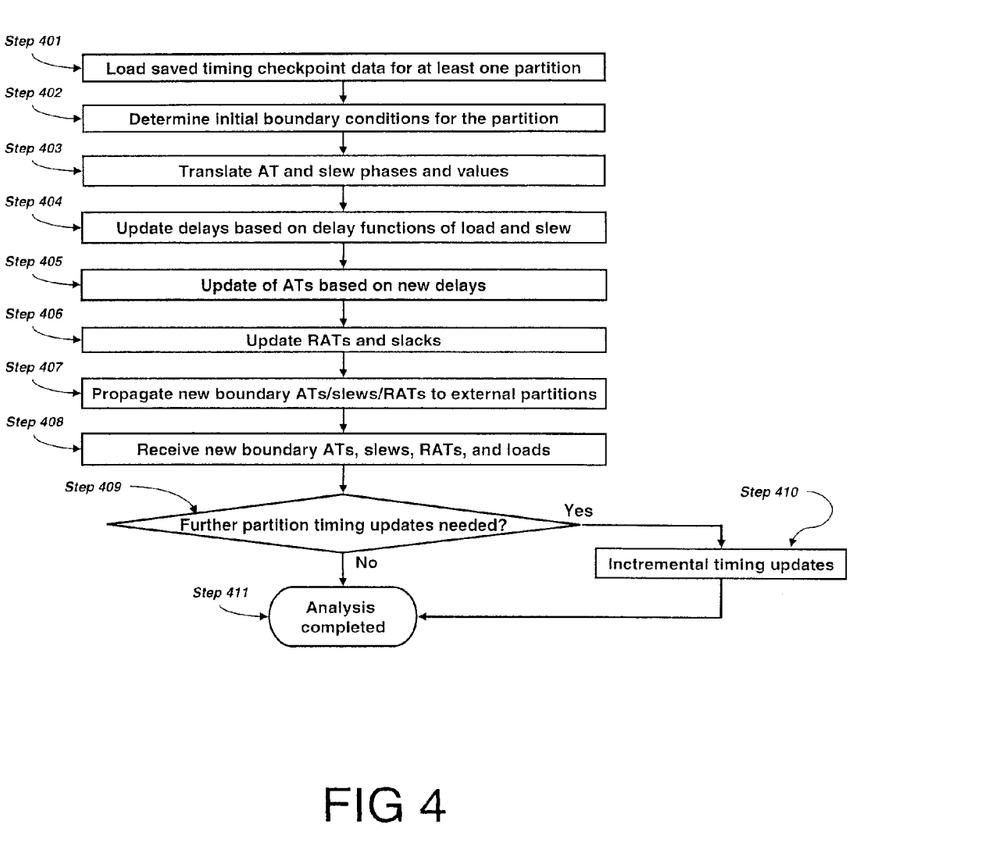
FIG. 4 shows a flowchart illustrating a second embodiment of a restart timing run of the present invention.

A second embodiment of the restart analysis run is illustrated in FIG. 4. Starting from Step 401 timing checkpoint timing, preferably consisting of ATs, Slews, RATs, delay functions, and external loads from the checkpoint analysis run, is loaded to a partition of the top-level design. In Step 402, an initial set of boundary conditions and phase tags for the partition is determined. These may include the boundary conditions stored in the checkpoint file, or partial values propagated to the boundaries of the partition from the rest of the containing design, or some combination thereof (e.g., estimated input port slew values based on the immediate drive of the port, with ATs and RATs from the checkpoint timing run).

In steps 403 through 406, the values and phase tags from the checkpoint timing run are adjusted and translated based on the phase tags and boundary conditions of the partition. In Step 403, the AT and slew values are from the checkpoint timing run are translated according to the method previously described with reference to FIG. 2.

The translation of Step 403 will preferably use phase tags of the global phase tags as target phase tags. This results in a smaller number of target phase tags than in the first embodiment and, hence, in a smaller amount of timing data stored on the nodes of the partition. The disadvantage thereof is that a particular node AT value can no longer be associated to a specific input port, and hence iterative updates become more difficult. In such an instance, prior art incremental timing update methods, e.g., as described in U.S. Pat. No. 5,508,937 may be used.

For the example described previously in explanation of Step 303 of FIG. 3, AT translation for node N is:

$$AT\_X\_late(N)=\max(AT\_A\_late(N)+AT\_X\_late(A)- AT\_A\_late(A), AT\_B\_late(N)+AT\_X\_late(B)- AT\_A\_late(B))$$

$$AT\_X\_early(N)=\min(AT\_A\_early(N)+AT\_X\_early (A)-AT\_A\_early(A), AT\_B\_early(N)+AT\_X\_early(B)-AT\_A\_early(B))$$

$$AT\_Y\_late(N)=AT\_A\_late(N)+AT\_Y\_late(A)-AT\_A\_late(A)$$

$$AT\_Y\_early(N)=AT\_A\_early(N)+AT\_Y\_early(A)- AT\_A\_early$$

In Step 404, delays of each timing graph are updated based on the aforementioned delay functions for the input slew and output load. Generally, assuming that a timing graph edge (E) depends on an input slew with a delta value of (S) and, further, it depends on output load with delta value of (L), then Delay(E)update=Delay(E)checkpoint+slew function (S)+load function(L)

Generally, only a small fraction of the timing graph edges depends on either input slew or output load. Hence, a majority of delay values need not to be recomputed.

In Step 405, ATs are updated based on the updated delay values. Since only a small fraction of the delays depends on the input slew and output load and, generally, a subset of input slew and output load values are typically updated in an incremental fashion, it follows that the dominance limiting reduces the region requiring delay updates. Thus, the AT update approach described results in many fewer calculations compared to prior art techniques such as abstraction which requires recalculating all the ATs within a subsequent analysis run.

In Step 406, RATs are updated in response to AT or delay changes in the aforementioned steps. In addition, RAT changes at partition output ports will be propagated back through the partition using conventional incremental timing analysis update methods.

In Step 407, a new partition input RATs and partition output ATs (if any) are communicated to external partitions. In Step 408, new boundary conditions are received at the boundaries of the partition, e.g., due to updates propagated from other partitions.

In Step 409, a determination is made as to whether timing updates must be performed. One way to make this determination is by requiring updates when boundary conditions change. This may cause additional timing updates than are really necessary to determine whether the timing requirements are met. A more efficient decision method will be described hereinafter with reference to FIG. 5. If it is determined that no timing updates are needed, the method proceeds to Step 411, and the analysis is complete. Otherwise, the method proceeds to Step 410, in which conventional incremental timing analysis (e.g., as described in U.S. Pat. No. 5,508,937) is used to perform any necessary timing updates, before proceeding to Step 411, at which point the analysis terminates.

Figure 5:
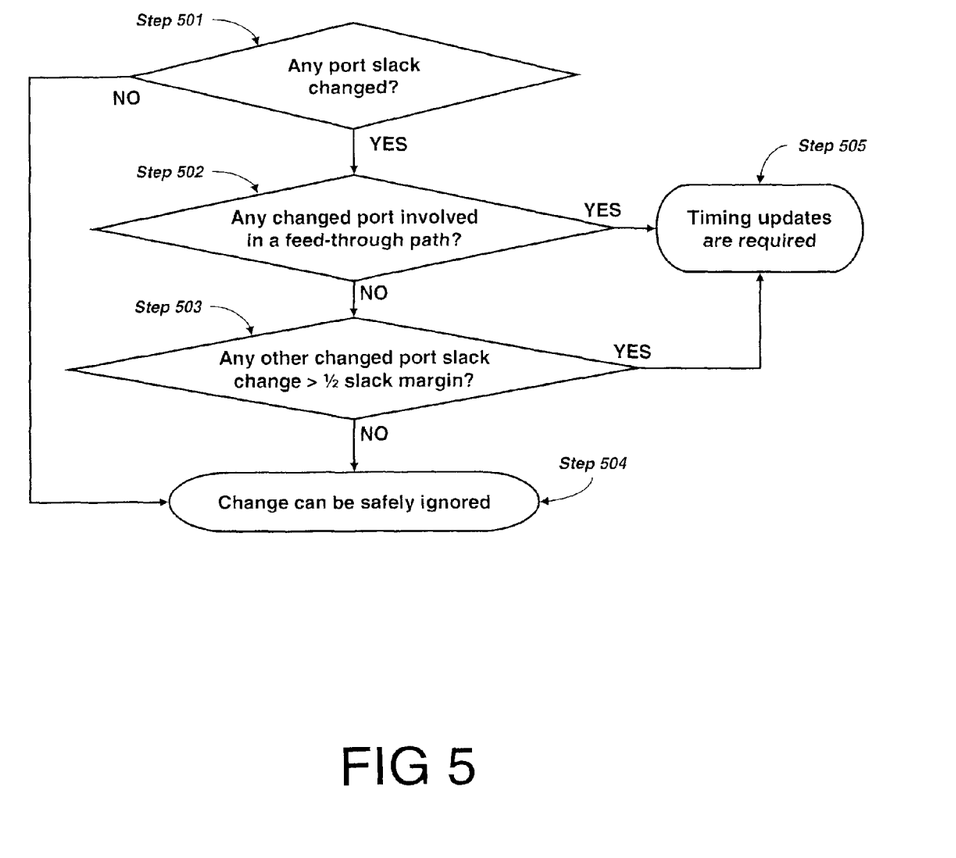
FIG. 5 shows a flowchart illustrating a decision process for determining whether further timing updating is required according to an embodiment of the present invention

FIG. 5 shows a flowchart illustrating a method for determining whether timing updates are required, e.g., in Step 309 or 409 of FIG. 3 or 4, respectively. In Step 501, a check is made to determine if the slack value for any port changed between Step 306 or 406 and steps 308 or 408. If not, the decision process proceeds to Step 504 and reports that no timing updates are required. Otherwise, the method proceeds to Step 502.

In Step 502, each port having a modified slack is analyzed to determine if it is found in any feedthrough path. (A feedthrough path of a partition is an unlatched input to output path). These can be easily identified from the information read from the checkpoint timing run. An input port is involved in a feed through port when the phase tag assigned to it in the checkpoint timing run is propagated to a primary output port; otherwise, it is not. If any changed port is involved in the feed through path, the method proceeds to Step 505 and it reports that timing updates are required. Else, the method proceeds to Step 503.

In Step 503, each port with a changed slack is inspected to establish whether the slack changes (specifically, the amount by which the slack decreases, or becomes worse) e.g., is greater than one-half the slack margin of the port based on the slack computed in Step 306 or 406. If it is smaller than that for all such ports, the local slack change is not sufficiently large to contribute to the total slack change along a path that will cause the slack to become less than the slack threshold. Then, the algorithm proceeds to Step 504 and reports that no timing updates are required. Only one-half of the slack margin can be used because the other half may be used by a local slack change at the other end of the path (e.g., at a port of another partition). The reason why ports involved in feed through paths cannot tolerate any slack change without performing timing updates is because it is not possible to determine how many changed slack ports (e.g., in different change partitions) may be involved in the path and, hence, what fraction of the total slack margin can safely be allowed at any port. If the slack change in any port is greater than the slack margin of the port, the algorithm proceeds to Step 505 and reports that timing updates are required.

Finally, the present invention can be realized in hardware, software, or a combination of hardware and software. The present invention can be realized in a centralized fashion in one computer system or in a distributed fashion where different elements are spread across several interconnected computer systems. Any kind of computer system—or other apparatus adapted for carrying out the methods described herein—is suitable. A typical combination of hardware and software could be a general purpose computer system with a computer program that, when being loaded and executed, controls the computer system such that it carries out the methods described herein.

The present invention can also be embedded in a computer program product, which comprises all the features enabling the implementation of the methods described herein, and which—when loaded in a computer system—is able to carry out these methods.

Computer program means or computer program in the present context mean any expression, in any language, code or notation, of a set of instructions intended to cause a system having an information processing capability to perform a particular function either directly or after conversion to another language, code or notation and/or reproduction in a different material form.

While the present invention has been particularly described in conjunction of a simple illustrative embodiment, it is to be understood that one of ordinary skill in the art can extend and apply the invention in many obvious ways. In the preferred embodiments, for purposes of clarity, rising and falling timing quantities were not differentiated, but one of ordinary skill in the art could apply the present invention to a situation with different rising and falling delays, slews, ATs and RATs. The invention applies to any type of static timing, including but not limited to deterministic or statistical static timing of gate-level circuits, transistor-level circuits, hierarchical circuits, circuits with combinational logic, circuits with sequential logic, timing in the presence of coupling noise, timing in the presence of multiple-input switching, timing in the presence of arbitrary timing tests such as setup, hold, end-of-cycle, pulse width, clock gating and loop-cut tests, and timing in the presence of multiple clock domains. It is therefore contemplated that the appended claims will embrace any such alternatives, modifications and variations as falling within the true scope and spirit of the present invention.

What is claimed is:

1. A method for measuring timing performance of an integrated circuit (IC) chip, said IC chip being represented by a hierarchical design, the method comprising:
   using a computer, performing an initial static timing run on at least one partition of said hierarchical design, each input of said at least one partition being assigned a unique phase tag;
   determining dependencies of timing values on at least one partition boundary condition;
   generating a checkpoint timing based on said determined dependencies of timing values, said checkpoint timing comprising at least one of arrival time (AT), required arrival time (RAT) and slew values, and incorporating said at least one of AT, RAT and slew values into a subsequent static timing analysis run;
   performing a local update of said at least one of AT, RAT, and slew values and dependencies thereof based on said new boundary condition values; and
   measuring said timing performance of said at least one partition of said hierarchical design based upon said locally updated at least one of AT, RAT and slew values.

2. The method recited in claim 1, wherein during restarted timing run, said checkpoint timing is read during which an initial translation of said ATs, RATs, and slews are followed by said local updates based on adjusted ATs, RATs, and slews.

3. The method recited in claim 2, wherein said translation is from said unique input phase tags to a set of cross-product phases between said unique input phase tags and global phase tags.

4. The method recited in claim 2, wherein said translation is created from said unique input phase tags to global phase tags.

5. The method recited in claim 1, wherein a plurality of hierarchical modules are updated, and a global recalculation of said timing values is performed based on a slack change threshold.

6. The method recited in claim 1 wherein said boundary conditions include an input slew, an input AT, and an output load.

7. The method recited in claim 1 wherein said dependencies on said at least one partition boundary conditions are determined by a finite differencing input slew.

8. The method recited in claim 1 wherein said dependencies on partition boundary conditions are determined by composing functions for input slew dependency along a path.

9. The method recited in claim 1 wherein said dependencies on partition boundary conditions are determined by finite differencing output load.

10. The method recited in claim 1 further comprising propagating boundary AT, slew, and RAT values to additional partitions.

11. The method recited in claim 1 further comprises receiving new boundary ATs, slews, and RATs and iterating said new boundaries until convergence is achieved.

12. The method recited in claim 10 wherein said new boundary ATs, slews and RATs propagate when a change in slack is greater than a predetermined margin.

13. The method recited in claim 12 wherein said predetermined margin is a percentage of an available positive slack.

14. The method recited in claim 1 wherein said timing runs are performed at a gate-level, at a transistor-level or statistically.

15. A method for improving timing performance of an integrated circuit top-level chip design comprising:
   using a computer, performing an initial static timing run on at least one partition of said hierarchical design, each input of said at least one partition being assigned a unique phase tag;
   generating a checkpoint timing based on said determined dependencies of timing values, said checkpoint timing comprising at least one of arrival time (AT), required arrival time (RAT) and slew values, and incorporating said at least one of AT, RAT and slew values into a subsequent static timing analysis run;
   analyzing each delay and slew value for dependency on said at least one partition input slew and on said at least partition output load;
   storing all ATs, slew, RATs, delay and slew dependencies as checkpoint timing;
   performing a subsequent analysis wherein ATs, slews and RATs from said saved checkpoint timing are applied;
   updating AT values based on said unique phase tags and correspondence to input ATs, delays and slews based on said delay and slew dependencies, ATs and RATs based on said updated delays; and
   measuring the improved timing performance of said integrated circuit top-level chip design based on said updated AT values, slews, RATs, and delays.

16. A program storage device readable by a machine, tangibly embodying a program of instructions executable by the machine to perform method steps for measuring timing performance of an integrated circuit (IC) chip, said IC chip being represented by a hierarchical design, the method comprising:
   using a computer, performing an initial static timing run on at least one partition of said hierarchical design, each input of said at least one partition being assigned a unique phase tag;
   determining dependencies of timing values on at least one partition boundary condition;
   generating a checkpoint timing based on said determined dependencies of timing values, said checkpoint timing comprising at least one of arrival time, required arrival time and slew values, and incorporating said at least one of arrival time, required arrival time and slew values into a subsequent static timing analysis run;
   performing a local update of said at least one of arrival time, required arrival time, and slew values and dependencies thereof based on said new boundary condition values; and
   measuring said timing performance of said at least one partition of said hierarchical design based upon said locally updated at least one of arrival time, required arrival time and slew values.

* * * * *